(12) United States Patent
Kobayashi

(10) Patent No.: US 11,430,628 B1
(45) Date of Patent: Aug. 30, 2022

(54) CATHODE MECHANISM OF ELECTRON GUN, ELECTRON GUN, AND ELECTRON BEAM WRITING APPARATUS

(71) Applicant: NuFlare Technology, Inc., Yokohama (JP)

(72) Inventor: Ryoei Kobayashi, Yokosuka (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 17/647,198

(22) Filed: Jan. 6, 2022

(30) Foreign Application Priority Data

Feb. 25, 2021 (JP) .............................. JP2021-029008

(51) Int. Cl.
- *H01J 29/45* (2006.01)
- *H01J 29/48* (2006.01)
- *H01J 29/51* (2006.01)

(52) U.S. Cl.
CPC .......... *H01J 29/485* (2013.01); *H01J 29/488* (2013.01); *H01J 29/51* (2013.01)

(58) Field of Classification Search
CPC ......... H01J 29/485; H01J 29/488; H01J 29/51
See application file for complete search history.

(56) References Cited

U.S. PATENT DOCUMENTS

| | | | | |
|---|---|---|---|---|
| 4,721,878 A | * | 1/1988 | Hagiwara | ............. H01J 37/073 313/336 |
| 10,573,481 B1 | * | 2/2020 | Katsap | .................... H01J 3/027 |
| 2014/0055025 A1 | * | 2/2014 | Yasuda | .................. B82Y 10/00 313/364 |

FOREIGN PATENT DOCUMENTS

JP      2001-84932 A      3/2001

* cited by examiner

*Primary Examiner* — Anne M Hines
(74) *Attorney, Agent, or Firm* — Oblon, McClelland, Maier & Neustadt, L.L.P.

(57) ABSTRACT

A cathode mechanism of an electron gun includes a crystal to emit a thermal electron from an end surface by being heated, a holding part to hold the crystal in a state where the end surface is exposed and at least a part of other surfaces of the crystal is covered, a first supporting post and a second supporting post each to support the holding part and extend while maintaining an unchanged sectional size, a first base part to fix the first supporting post, and a second base part to fix the second supporting post, wherein the holding part, the first supporting post, the second supporting post, the first base part, and the second base part are formed in an integrated structure made of the same material, and the crystal is heated by supplying a current to the integrated structure.

10 Claims, 10 Drawing Sheets

CATHODE MECHANISM OF ELECTRON GUN, ELECTRON GUN, AND ELECTRON BEAM WRITING APPARATUS

CROSS-REFERENCE TO RELATED APPLICATION

This application is based upon and claims the benefit of priority from prior Japanese Patent Application No. 2021-029008 filed on Feb. 25, 2021 in Japan, the entire contents of which are incorporated herein by reference.

BACKGROUND OF THE INVENTION

Field of the Invention

One aspect of the present invention relates to a cathode mechanism of an electron gun, an electron gun, and an electron beam writing apparatus.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits is becoming increasingly narrower year by year. The electron beam writing technique which intrinsically has excellent resolution is used for writing or "drawing" a mask pattern on a mask blank with electron beams.

For example, as a known example of employing the electron beam writing technique, there is a writing apparatus using multiple beams. Since it is possible for multi-beam writing to apply multiple beams at a time, the writing throughput can be greatly increased in comparison with single electron beam writing. For example, a writing apparatus employing the multi-beam system forms multiple beams by letting portions of an electron beam emitted from an electron gun individually pass through a corresponding one of a plurality of holes in a mask, performs blanking control for respective formed beams, reduces by an optical system beams that were not blocked in the blanking process to reduce a mask image, and deflects the reduced beams by a deflector to irradiate a desired position on a target object or "sample".

In a thermal electron gun emitting electron beams, the operating temperature of the cathode increases along with achieving higher luminance of the cathode. The conventional cathode is assembled by mechanically combining a plurality of parts through which currents flow. Therefore, there exist a plurality of electric contact portions, resulting in a problem that resistance of the entire cathode becomes unstable. Moreover, when a plurality of parts through which currents flow are fixed within a ceramic serving as an insulating part, the temperature of the ceramic also increases at the time of heating, resulting in a problem that insulation breakdown tends to occur easily.

There is disclosed a cathode mechanism, integrated from glassy carbon, composed of a pair of energizing terminals, a pair of legs each extending from each of the terminals such that the sectional area of the leg gradually becomes small, and a support part which connects the pair of legs at the narrowest portions and on which lanthanum hexaboride ($LaB_6$) powder is placed (e.g., refer to Japanese Patent Application Laid-open (JP-A) No. 2001-084932).

BRIEF SUMMARY OF THE INVENTION

According to one aspect of the present invention, a cathode mechanism of an electron gun includes a crystal configured to emit a thermal electron from an end surface by being heated, a holding part configured to hold the crystal in a state where the end surface is exposed and at least a part of other surfaces of the crystal is covered, a first supporting post and a second supporting post each configured to support the holding part and extend while maintaining an unchanged sectional size, a first base part configured to fix the first supporting post, and a second base part configured to fix the second supporting post, wherein the holding part, the first supporting post, the second supporting post, the first base part, and the second base part are formed in an integrated structure made of a same material, and the crystal is heated by supplying a current to the integrated structure.

According to another aspect of the present invention, an electron gun includes the cathode mechanism of the electron gun described above, and an anode electrode configured to be controlled to have a potential more positive than that of a crystal and to pull out a thermal electron emitted from the crystal.

According to yet another aspect of the present invention, an electron beam writing apparatus includes the electron gun described above, and a writing mechanism configured to write a pattern on a target object using a thermal electron emitted from the electron gun.

DETAILED DESCRIPTION OF THE INVENTION

Embodiments below describe a cathode mechanism that can heat a crystal efficiently while providing stability of resistance of a cathode and prevention of an insulation breakdown.

Further, Embodiments below describe a configuration using multiple beams as an electron beam. However, it is not limited thereto. A configuration using a single beam is also acceptable. Further, although a writing apparatus is described below, any other apparatus is also preferable as long as it uses electron beams emitted from a thermal electronic emission source. For example, it may be an image acquisition apparatus, an inspection apparatus, or the like.

First Embodiment

Figure 1:
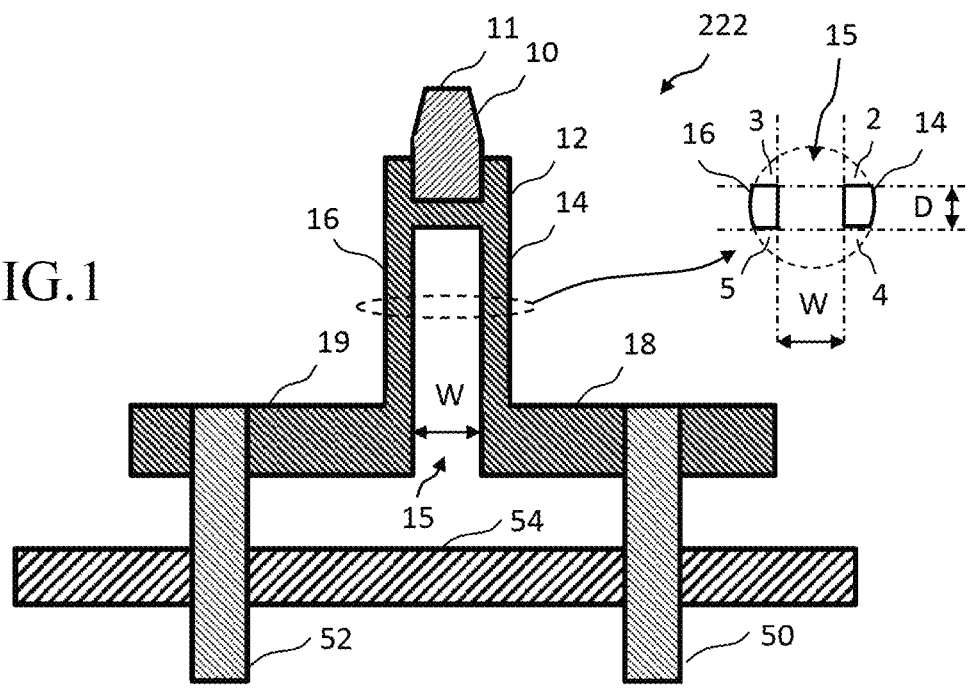
FIG. 1 is a sectional view showing an example of a configuration of a cathode mechanism of an electron gun according to a first embodiment.
Figure 2:
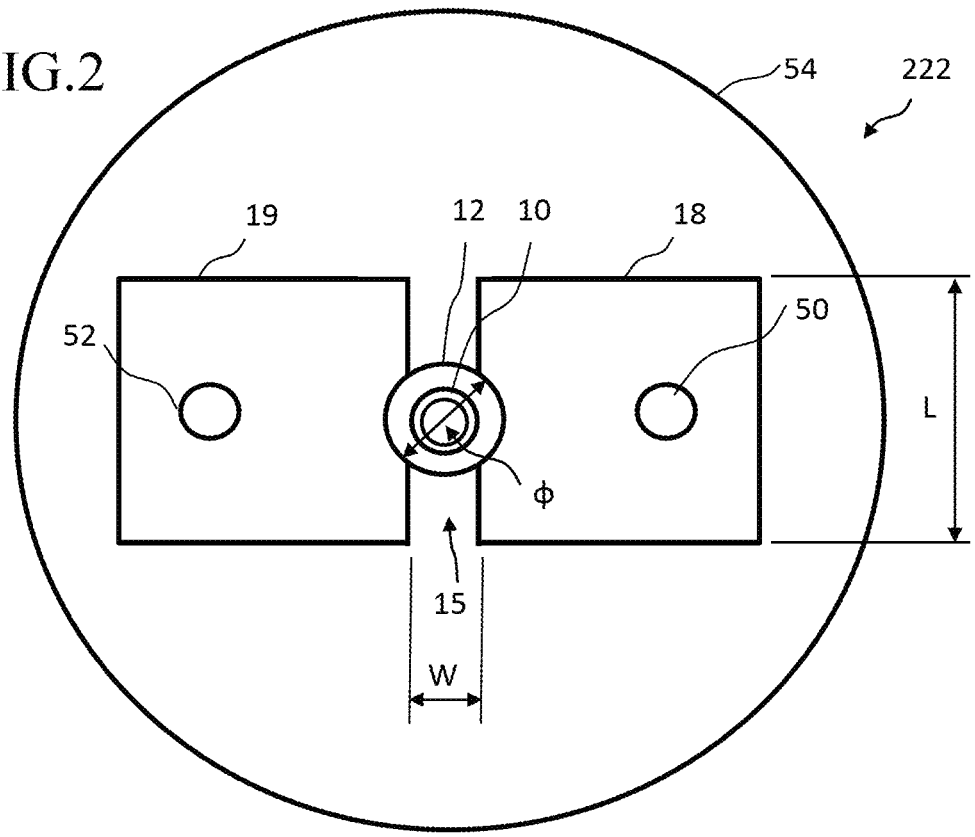
FIG. 2 is a top view showing an example of a configuration of a cathode mechanism of an electron gun according to the first embodiment.
Figure 3:
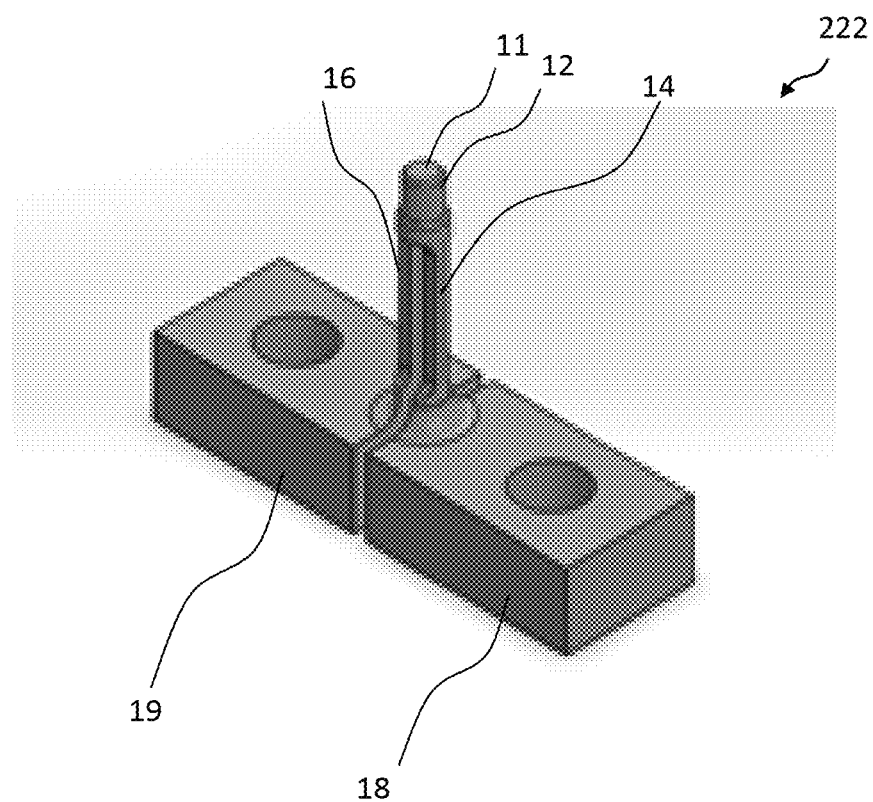
FIG. 3 is a perspective view for reference showing an example of a configuration of a cathode mechanism of an electron gun according to the first embodiment.

FIG. 1 is a sectional view showing an example of a configuration of a cathode mechanism of an electron gun according to a first embodiment. FIG. 2 is a top view showing an example of a configuration of a cathode mechanism of an electron gun according to the first embodiment. FIG. 3 is a perspective view for reference showing an example of a configuration of a cathode mechanism of an electron gun according to the first embodiment. The shape of a part of the cathode mechanism shown in FIG. 3 does not coincide with the shape shown in FIGS. 1 and 2. A cathode mechanism 222 (negative electrode mechanism) of the electron gun in FIGS. 1 and 2 includes a crystal 10, a holding part 12, a pair of supporting posts 14 and 16, and a pair of base parts 18 and 19.

By being heated, the crystal 10 emits thermal electrons from an electron emission surface 11 being an end surface. As a material of the crystal 10, lanthanum hexaboride ($LaB_6$) is used, for example. Crystal orientations in the electron emission surface 11 of the crystal 10 are the same. For example, it is preferable to have a crystal orientation of (100) or (310). The crystal 10 is formed in the shape of at least one of a cylinder and a truncated cone. For example, as shown in FIG. 1, it is preferable to form by combining a cylindrical lower part and a truncated cone upper part. Alternatively, it may be formed in a cylinder from the lower part to the upper part. Alternatively, it may be formed in a truncated cone or a prism from the lower part to the upper part.

The holding part 12 holds the crystal 10 in a manner such that the electron emission surface 11 of the crystal 10 is exposed and at least a part of the other surfaces of the crystal 10 is covered. A hole of a predetermined depth is formed in the center of the top surface of the cylindrical holding part 12. The size of the hole is matched with the size of the crystal 10. The crystal 10 is held by being inserted into the hole from the lower part. Thereby, in the example of FIG. 1, the bottom surface and the side surface at the lower part of the crystal 10 are covered. The holding part 12 contacts the crystal 10 at the covered surfaces to heat the crystal 10 and applies an acceleration voltage to the crystal 10. When the crystal 10 is a cylinder, a truncated cone, or a combination of them, the shape of the hole of the holding part 12 may be a cylinder. When the crystal 10 is a prism, the shape of the hole of the holding part 12 may be a prism.

The pair of supporting posts, 14 (first supporting post) and 16 (second supporting post), supports the holding part 12. Each of the pair of supporting posts 14 and 16 extends while maintaining an unchanged sectional size substantially. The pair of supporting posts 14 and 16 is arranged with a space width W therebetween. The pair of supporting posts 14 and 16 functions as a heater for heating the crystal 10 through the holding part 12.

The pair of base parts 18 and 19 fixes the pair of supporting posts 14 and 16. Specifically, the base part 18 fixes the bottom end of the supporting post 14, and the base part 19 fixes the bottom end of the supporting post 16. The base part 18 is connected to a metal electric wire 50 supported by an insulator 54, and is supported by the electric wire 50. The base part 19 is connected to a metal electric wire 52 supported by the insulator 54, and is supported by the electric wire 52.

The holding part 12, the pair of supporting posts 14 and 16, and the pair of base parts 18 and 19 are formed in an integrated structure made of the same material. As a material of the integrated structure, one of graphite, tantalum, tungsten, and iridium can be used. When forming the holding part 12, the pair of supporting posts 14 and 16, and the pair of base parts 18 and 19 in an integrated structure, first, a base material is formed in the shape in which a cylinder is upright in the center of the tabular base part. A width L of the base part is preferably sufficiently larger than a diameter φ of the cylinder. For example, the width L is equal to or greater than twice the diameter φ. In the cases of FIGS. 2 and 3, the width L is about three times the diameter p, for example. Then, the width W is notched at the center with respect to the longitudinal direction of the base part and at the position passing through the center axis of the cylinder. The width W is notched such that the portion corresponding to the holding part 12 is left, the base parts 18 and 19 are separated, and the supporting posts 14 and 16 are separated. Thereby, a current flow can be formed in series in order of the base part 18, the supporting post 14, the holding part 12, the supporting post 16, and the base 19. Further, thereby, a continuous space having the same width W is formed from the back side of the holding part 12, between the two supporting posts 14 and 16, and between the two base parts 18 and 19. Moreover, a hole of a predetermined depth is formed in the center of the top surface of the cylindrical holding part 12. The diameter size of the hole is matched with the size of the crystal 10. The depth of the hole is preferably equal to or less than the length of the crystal 10. Thereby, the holding part 12, the pair of supporting posts 14 and 16, and the pair of base parts 18 and 19 can be formed in an integrated structure.

Since the current flowing into the base part 18 of the width L through the electric wire 50 has a large sectional area, resistance can be suppressed small, and therefore, the amount of heat generation can be suppressed. Then, since the supporting post 14 whose sectional area rapidly becomes small from that of the base part 18 has a high resistance, the amount of heat generation can be increased. For example, in the case of the shape whose sectional area gradually becomes small, since the portion having a high resistance is small, a large electric power is needed for obtaining a necessary heat generation amount. On the other hand, according to the first embodiment, since the supporting post 14 extends toward the holding part 12 while maintaining a small sectional area, the high resistance state can be maintained. Therefore, when obtaining a necessary amount of heat generation, a small electric power is sufficient for generating heat efficiently. The same applies to the supporting post 16.

As described above, the pair of supporting posts 14 and 16 is carved out from the cylindrical portion having the diameter φ. The cylindrical portion having the diameter φ is carved into halves by performing width-W notching at the center while leaving the portion corresponding to the holding part 12. Further, as shown in the top view of the pair of supporting posts, illustrated at the upper right of FIG. 1, portions 2, 3, 4, and 5 at the both sides of the halved portions are carved such that the outer sides of the sectional surfaces of the pair of supporting posts 14 and 16, each width being D, are circular arcs. Thereby, each of the supporting posts 14 and 16 has a cross-sectional configuration in which three sides are straight lines and one side is a curved line. The sectional areas of the supporting posts 14 and 16 can be made smaller by further carving the portions 2, 3, 4, and 5 at the both sides of the halved portions. By making the sectional area small, resistance is increased, and therefore, when a current flows, the temperature can be raised efficiently.

Thus, theater can be easily fabricated by scraping off the slit portion (W) and the portions 2, 3, 4, and 5 from the cylinder made of graphite by a lathe operation, for example. That is, the configuration is easily made. Further, since the cylinder is equally formed by the lathe operation and has a little stress because of being formed with a light load, a crack etc. seldom occurs on the cylinder itself. Further, the resistance can be increased since the sectional area is small, and the structure intensity is improved more than that of a quadrangle.

Figure 4:
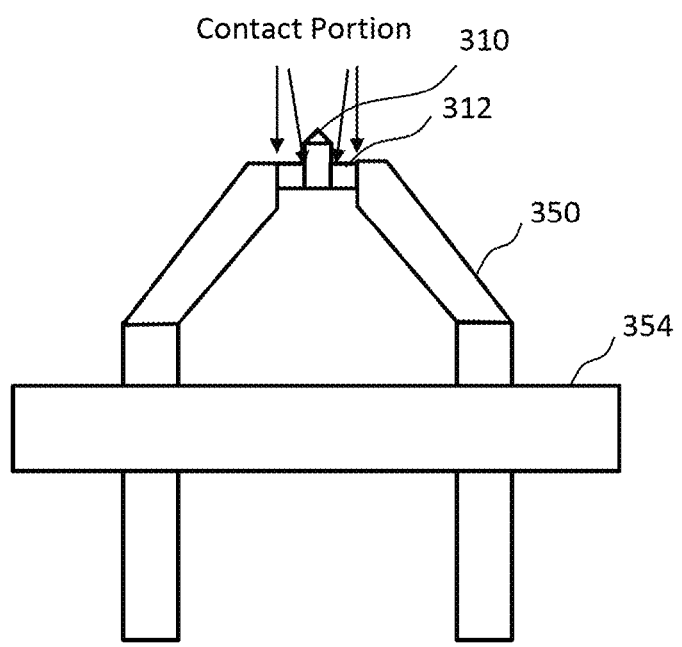
FIG. 4 is a diagram showing an example of a configuration of a cathode mechanism according to a comparative example 1 of the first embodiment 1.

FIG. 4 is a diagram showing an example of a configuration of a cathode mechanism according to a comparative example 1 of the first embodiment 1. In FIG. 4, in the comparative example 1, two lead wires 350 which vertically penetrate a disc-like ceramic base 354 from the outside to be fixed are bent and extending mutually toward inside after penetrating the ceramic base 354, for example. Then, at the ends of the two lead wires 350, a crystal 310 is put between tabular pyrolytic graphite (PG) portions 312. In this configuration, there are a mechanical and electrical contact portion between each lead wire 350 and each PG portion 312, and a mechanical and electrical contact portion between the two PG portions 312 and the crystal 310. In particular, the crystal 310 contacts, for junction, the tip of each tabular PG portion 312. Therefore, there is a problem that the contact resistance at these contact portions tends to change easily.

Figure 5:
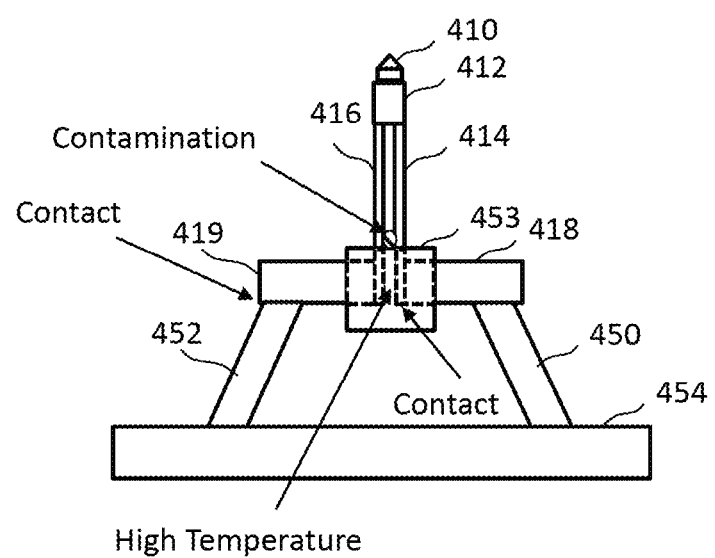
FIG. 5 is a diagram showing an example of a configuration of a cathode mechanism according to a comparative example 2 of the first embodiment.

FIG. 5 is a diagram showing an example of a configuration of a cathode mechanism according to a comparative example 2 of the first embodiment. In FIG. 5, in the comparative example 2, for example, two base pins 450 and 452 extend diagonally toward inside from the upper surface peripheral part of a disc-like ceramic base 454, and a leaf spring 418 is connected to the end part of the base pin 450. Similarly, a leaf spring 419 is connected to the end part of the base pin 452. The leaf springs 418 and 419 extend, toward the center part, in parallel to the upper surface of the ceramic base 454, and are fixed inside a small insulating insulator block 453 disposed at the center part. In the insulator block 453, a heater rod 414 is connected to the leaf spring 418. Similarly, in the insulator block 453, a heater rod 416 is connected to the leaf spring 419. The two heater rods 414 and 416 centered by the insulator block 453 extend vertically to be connected to a holding part 412. A crystal 410 is fittingly inserted into the upper surface of the holding part 412. In this configuration, there are mechanical and electrical contact portions between the edge portion of the base pin 450 and the leaf spring 418, and between the edge portion of the base pin 452 and the leaf spring 419. Moreover, in the insulator block 453, there are mechanical and electrical contact portions between the heater rod 414 and the leaf spring 418, and between the heater rod 416 and the leaf spring 419. Therefore, there is a problem that the contact resistances at these contact portions tend to change easily. Further, since the temperatures of the heater rods 414 and 416 become high, the temperature of the insulator block 453 itself also becomes high. As a result, although the material of the insulator block 453 originally has excellent insulation, an insulation failure occurs in the insulator block 453. Consequently, there is a problem that insulation breakdown occurs between the heater rods 414 and 416 in the insulator block 453, resulting in that resistance of the whole cathode mechanism changes.

Furthermore, in the comparative example 2, there is a problem that since contamination accumulates on the insulator block 453 and electrically connects between the heater rods 414 and 416, insulation breakdown occurs between the heater rods 414 and 416, resulting in that resistance of the whole cathode mechanism changes.

On the other hand, according to the first embodiment, since the holding part 12, the pair of supporting posts 14 and 16, and the pair of base parts 18 and 19 are formed in an integrated structure made of the same material, there is no mechanical and electrical contact portion. Therefore, no contact resistance change occurs. Further, while each end of the pair of supporting posts 14 and 16 is connected to one of the separated base parts 18 and 19, since no insulator block exists, it is possible to prevent contamination accumulation. Thus, no insulation breakdown occurs between the supporting posts 14 and 16, and therefore, there is no change of resistance of the whole cathode mechanism.

As described above, according to the first embodiment, it is possible to provide stability of resistance of the cathode mechanism 222, and prevention of insulation breakdown, and to heat the crystal 10 efficiently. By stabilizing the electrical resistance of the cathode mechanism 222, temperature change of the crystal 10 can be prevented, thereby emitting stable thermal electrons.

Figure 6:
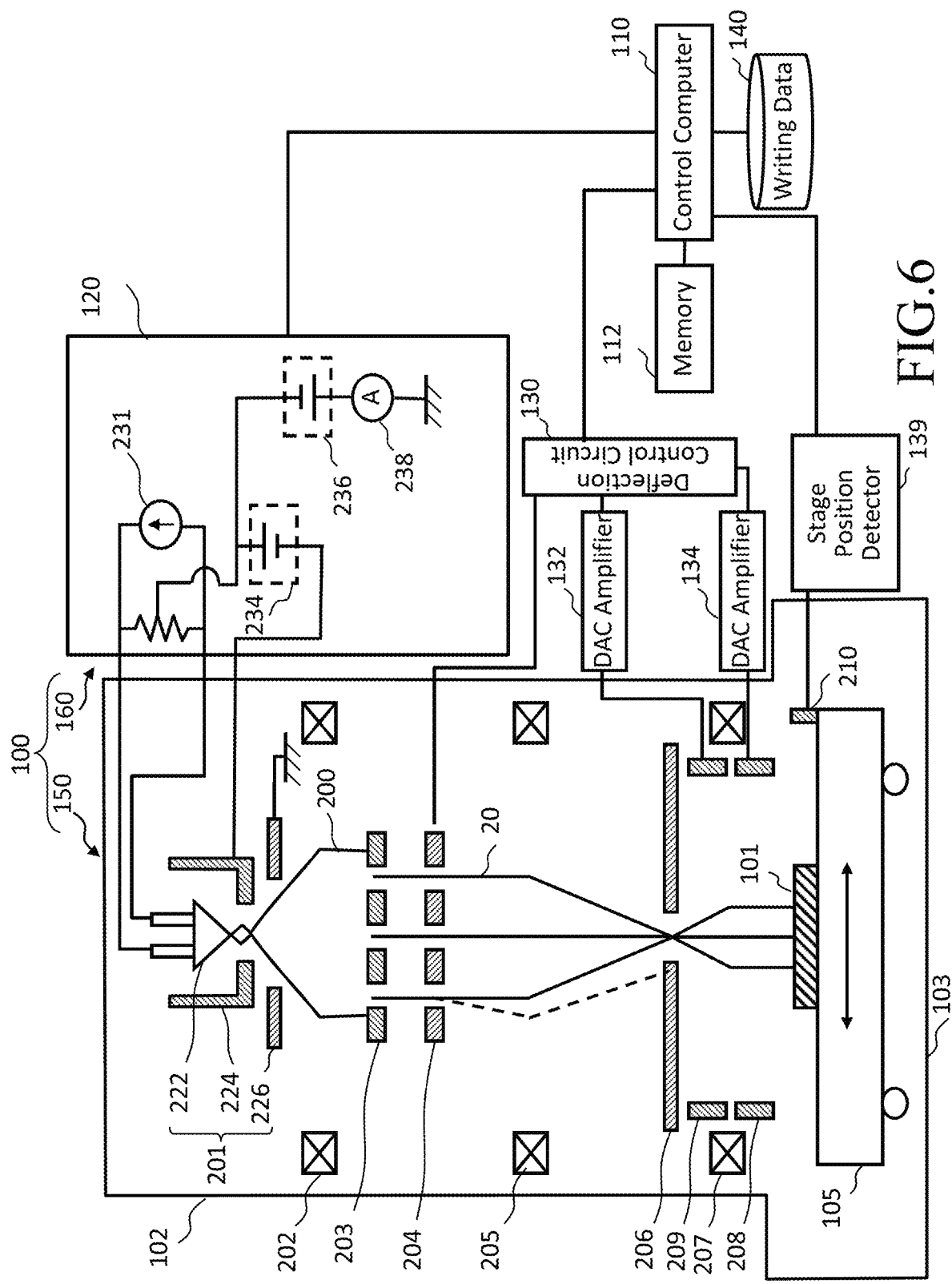
FIG. 6 is a diagram showing a configuration of a writing apparatus according to the first embodiment.

FIG. 6 is a schematic diagram showing a configuration of a writing or "drawing" apparatus according to the first embodiment. As shown in FIG. 6, a writing apparatus 100 includes a writing mechanism 150 and a control system circuit 160. The writing apparatus 100 is an example of a multiple electron beam writing apparatus. The writing mechanism 150 includes an electron beam column 102 (multiple electron beam column) and a writing chamber 103. In the electron beam column 102, there are disposed an electron gun 201, an illumination lens 202, a shaping aperture array substrate 203, a blanking aperture array mechanism 204, a reducing lens 205, a limiting aperture substrate 206, an objective lens 207, a deflector 208, and a deflector 209. In the writing chamber 103, an XY stage 105 is disposed. On the XY stage 105, there is placed a target object or "sample" 101 such as a mask blank on which resist has been applied serving as a writing target substrate when writing is performed. The target object 101 is, for example, an exposure mask used when fabricating semiconductor devices, or a semiconductor substrate (silicon wafer) for fabricating semiconductor devices. Further, on the XY stage 105, a mirror 210 for measuring the position of the XY stage 105 is placed.

The electron gun 201 (electron beam emission source) includes the above-described cathode mechanism 222. The electron gun 201 includes a Wehnelt 224 (Wehnelt electrode) and an anode 226 (anode electrode) in addition to the cathode mechanism 222. Further, the anode 226 is controlled to have a potential more positive than that of the crystal 10 of the cathode mechanism 222, and pulls out thermal electrons emitted from the crystal 10. For example, the anode 226 is grounded.

The control system circuit 160 includes a control computer 110, a memory 112, an electron gun power supply 120, a deflection control circuit 130, DAC (digital-analog converter) amplifier units 132 and 134, a stage position detector 139, and a storage device 140 such as a magnetic disk drive. The control computer 110, the memory 112, the electron gun power supply 120, the deflection control circuit 130, the DAC amplifier units 132 and 134, the stage position detector 139, and the storage device 140 are connected to each other through a bus (not shown). The DAC amplifier units 132 and 134 and the blanking aperture array mechanism 204 are connected to the deflection control circuit 130. Outputs of the DAC amplifier unit 132 are connected to the deflector 209. Outputs of the DAC amplifier unit 134 are connected to the deflector 208. The deflector 208 is composed of at least four electrodes (or "poles"), and each electrode is controlled by the deflection control circuit 130 through the DAC amplifier 134. The deflector 209 is composed of at least four electrodes (or "poles"), and each electrode is controlled by the deflection control circuit 130 through the corresponding DAC amplifier unit 132. The stage position detector 139 emits laser lights to the mirror 210 on the XY stage 105, and receives a reflected light from the mirror 210. The stage position detector 139 measures the position of the XY stage 105, based on the principle of laser interferometry which uses information of the reflected light.

Information input/output to/from the control computer 110 and information being operated are stored in the memory 112 each time.

In the electron gun power supply 120, there are arranged an acceleration voltage power circuit 236, a bias voltage power circuit 234, a filament power supply circuit 231 (filament power supply unit), and an ammeter 238.

The negative electrode (−) side of the acceleration voltage power circuit 236 is connected to the electric wires 50 and 52 of both the poles of the cathode mechanism 222 in the electron beam column 102. The positive electrode (+) side of the acceleration voltage power circuit 236 is grounded through the ammeter 238 connected in series. Further, the negative electrode (−) of the acceleration voltage power circuit 236 branches to be also connected to the positive electrode (+) of the bias voltage power circuit 234. The negative electrode (−) of the bias voltage power circuit 234 is electrically connected to the Wehnelt 224 disposed between the cathode mechanism 222 and the anode 226. In other words, the bias voltage power circuit 234 is arranged to be electrically connected between the negative electrode (−) of the acceleration voltage power circuit 236 and the Wehnelt 224. Then, the filament power supply circuit 231 supplies a current between the electric wires 50 and 52 of both the electrodes of the cathode mechanism 222 in order to heat the crystal 10 in the cathode mechanism 222 to a predetermined temperature. In other words, the filament power supply circuit 231 supplies a filament power to the cathode mechanism 222. The filament power and the cathode temperature T (heating temperature of the crystal 10) can be defined by a certain relation, and the cathode can be heated to a desired temperature by the filament power. Thus, the cathode temperature T is controlled by the filament power. The filament power is defined by the product of a current flowing between both the electrodes of the cathode mechanism 222 and a voltage applied between both the electrodes of the cathode mechanism 222 by the filament power supply circuit 231. The acceleration voltage power circuit 236 applies an acceleration voltage between the cathode mechanism 222 and the anode 226. The bias voltage power circuit 234 applies a negative bias voltage to the Wehnelt 224.

Writing data is input from the outside of the writing apparatus 100, and stored in the storage device 140. The writing data generally defines information on a plurality of figure patterns to be written. Specifically, it defines a figure code, coordinates, size, and the like of each figure pattern.

FIG. 6 shows a configuration necessary for describing the first embodiment. Other configuration elements generally necessary for the writing apparatus 100 may also be included therein.

Figure 7:
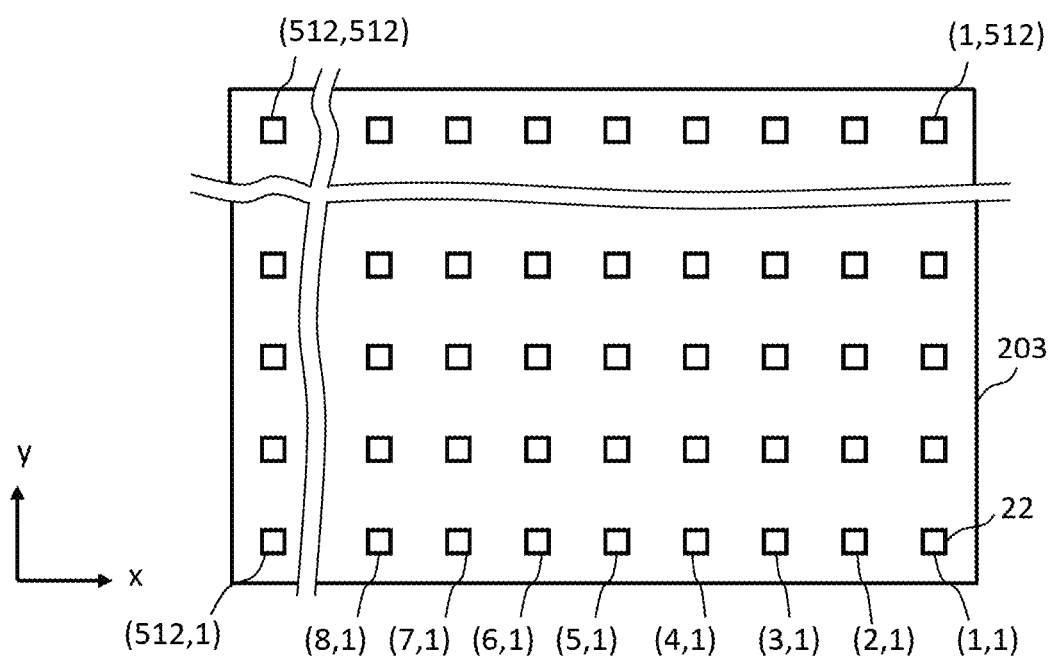
FIG. 7 is a conceptual diagram showing a configuration of a shaping aperture array substrate according to the first embodiment.

FIG. 7 is a conceptual diagram showing a configuration of the shaping aperture array substrate 203 according to the first embodiment. As shown in FIG. 7, holes (openings) 22 of p rows long (length in the y direction) and q columns wide (width in the x direction) (p≥2, p≥2) are formed, like a matrix, at a predetermined arrangement pitch in the shaping aperture array substrate 203. In the case of FIG. 7, for example, holes 22 of 512×512, that is 512 (rows of holes arrayed in the y direction)×512 (columns of holes arrayed in the x direction), are formed. Each of the holes 22 is rectangular, including square, having the same dimension and shape as each other. Alternatively, each of the holes 22 may be a circle with the same diameter as each other. The shaping aperture array substrate 203 (beam forming mechanism) forms multiple beams 20. Specifically, the multiple beams 20 are formed by letting portions of an electron beam 200 individually pass through a corresponding one of a plurality of holes 22. The method of arranging the holes 22 is not limited to the case of FIG. 7 where the holes are arranged like a grid in the width and length directions. For example, with respect to the x-direction kth and (k+1)th rows which are arrayed in the length direction (in the y direction), each hole in the kth row and each hole in the (k+1)th row may be arranged mutually displaced in the width direction (in the x direction) by a dimension "a". Similarly, with respect to the x-direction (k+1)th and (k+2)th rows which are arrayed in the length direction (in the y direction), each hole in the (k+1)th row and each hole in the (k+2)th row may be arranged mutually displaced in the width direction (in the x direction) by a dimension "b".

Figure 8:
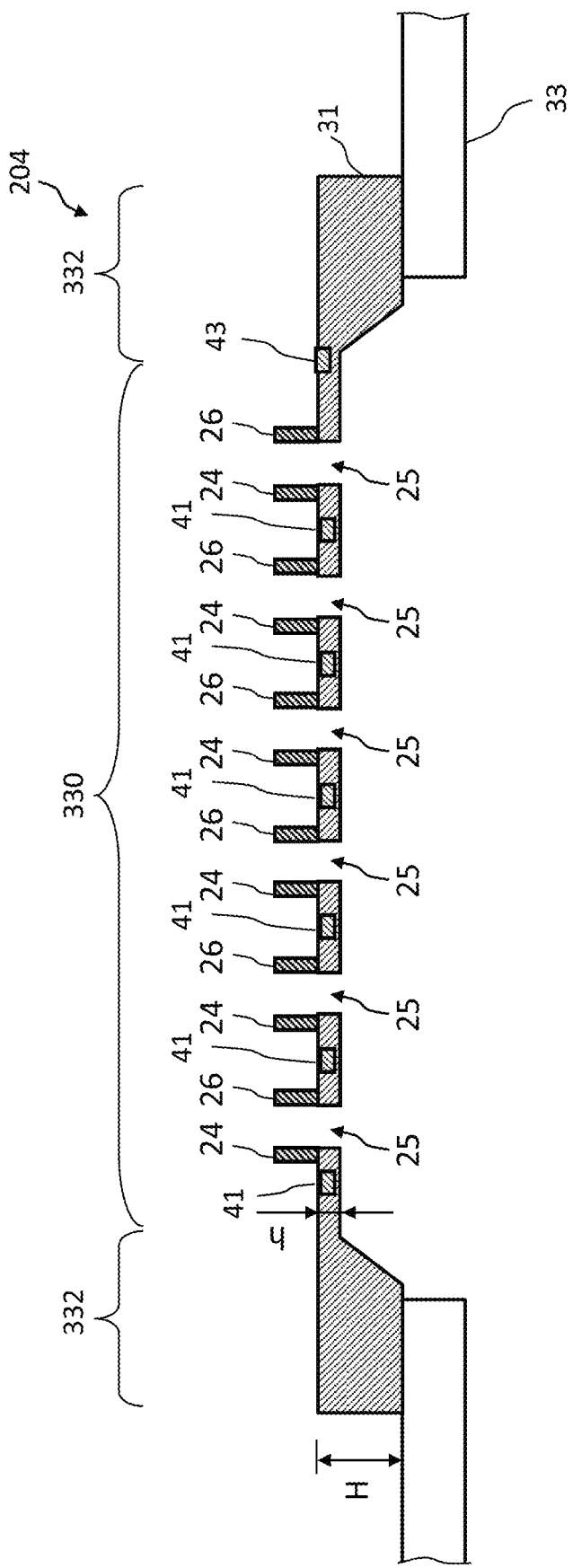
FIG. 8 is a sectional view showing a configuration of a blanking aperture array mechanism according to the first embodiment.

FIG. 8 is a sectional view showing a configuration of a blanking aperture array mechanism 204 according to the first embodiment. With regard to the configuration of the blanking aperture array mechanism 204, a semiconductor substrate 31 made of silicon, etc. is placed on a support table 33 as shown in FIG. 8. The central part of the substrate 31 is shaved, for example, from the back side into a membrane region 330 (first region) having a thin film thickness h. The periphery surrounding the membrane region 330 is an outer peripheral region 332 (second region) having a thick film thickness H. The upper surface of the membrane region 330 and the upper surface of the outer peripheral region 332 are formed to be flush or substantially flush in height with each other. At the back side of the outer peripheral region 332, the substrate 31 is supported on the support table 33. The central part of the support table 33 is open, and the membrane region 330 is located at this opening region.

In the membrane region 330, passage holes 25 (openings) through each of which a corresponding one of the multiple beams 20 passes are formed at positions each corresponding to each hole 22 in the shaping aperture array substrate 203 shown in FIG. 7. In other words, in the membrane region 330 of the substrate 31, there are formed a plurality of passage holes 25, in an array state, through each of which a corresponding one of the multiple electron beams 20 passes. Further, in the membrane region 330 of the substrate 31, there are arranged a plurality of electrode pairs each composed of two electrodes being opposite to each other with respect to a corresponding one of the plurality of passage holes 25. Specifically, in the membrane region 330, as shown in FIG. 8, each pair (blanker: blanking deflector) of a control electrode 24 and a counter electrode 26 for blanking deflection is arranged close to a corresponding passage hole 25 in a manner such that the electrodes 24 and 26 are opposite to each other across the passage hole 25 concerned. Further, close to each passage hole 25 in the membrane region 330, inside the substrate 31, there is arranged a control circuit 41 (logic circuit) which applies a deflection voltage to the control electrode 24 for the passage hole 25 concerned. The counter electrode 26 for each beam is grounded.

In the control circuit 41, there is arranged an amplifier (an example of a switching circuit) (not shown) such as a CMOS inverter circuit. The output line (OUT) of the amplifier is connected to the control electrode 24. On the other hand, the counter electrode 26 is applied with a ground electric potential. As an input (IN) of the amplifier, either an L (low) potential (e.g., ground potential) lower than a threshold voltage, or an H (high) potential (e.g., 1.5 V) higher than or equal to the threshold voltage is applied as a control signal. According to the first embodiment, in a state where an L potential is applied to the input (IN) of the amplifier, the output (OUT) of the amplifier becomes a positive potential (Vdd), and then, a corresponding beam is deflected by an electric field due to a potential difference from the ground potential of the counter electrode 26 so as to be blocked by the limiting aperture substrate 206, and thus it is controlled to be in a beam OFF condition. On the other hand, in a state (active state) where an H potential is applied to the input (IN) of the amplifier, the output (OUT) of the amplifier becomes a ground potential, and therefore, since there is no potential difference from the ground potential of the counter electrode 26, a corresponding beam is not deflected, and controlled to be in a beam ON condition by passing through the limiting aperture substrate 206.

A pair of the control electrode 24 and the counter electrode 26 individually provides blanking deflection of a corresponding beam of the multiple beams 20 by an electric potential switchable by the amplifier which serves as a corresponding switching circuit. Thus, each of a plurality of blankers performs blanking deflection of a corresponding beam in the multiple beams having passed through a plurality of holes 22 (openings) in the shaping aperture array substrate 203.

Next, operations of the writing mechanism 150 of the writing apparatus 100 will be described. The writing mechanism 150 writes a pattern on the target object 101, using thermal electrons emitted from the electron gun 201. Specifically, it operates as follows. The electron beam 200 emitted from the electron gun 201 (electron emission source) illuminates the whole of the shaping aperture array substrate 203 by the illumination lens 202. A plurality of rectangular (including square) holes 22 (openings) are formed in the shaping aperture array substrate 203. The region including all of the plurality of holes 22 is irradiated with the electron beam 200. For example, a plurality of rectangular (including square) electron beams (multiple beams 20) are formed by letting portions of the electron beam 200, which irradiate the positions of the plurality of holes 22, individually pass through a corresponding hole of the plurality of holes 22 in the shaping aperture array substrate 203. The multiple beams 20 individually pass through corresponding blankers (first deflector: individual blanking mechanism) of the blanking aperture array mechanism 204. Each blanker deflects (provides blanking deflection) an electron beam passing therethrough individually.

The multiple beams 20 having passed through the blanking aperture array mechanism 204 are reduced by the reducing lens 205, and go toward the hole formed in the center of the limiting aperture substrate 206. Then, the electron beam in the multiple beams 20 which was deflected by the blanker of the blanking aperture array mechanism 204 deviates (shifts) from the hole in the center of the limiting substrate 206 and is blocked by the limiting aperture substrate 206. On the other hand, the electron beam which was not deflected by the blanker of the blanking aperture array mechanism 204 passes through the hole in the center of the limiting aperture substrate 206 as shown in FIG. 6. Blanking control is provided by ON/OFF of the individual blanking mechanism so as to control ON/OFF of beams. Then, for each beam, one shot beam is formed by a beam which has been made during a period from becoming beam ON to becoming beam OFF and has passed through the limiting aperture substrate 206. The multiple beams 20 having passed through the limiting aperture substrate 206 are focused by the objective lens 207 so as to be a pattern image of a desired reduction ratio. Then, respective beams having passed (all of the multiple beams 20 having passed) through the limiting aperture substrate 206 are collectively deflected in the same direction by the deflectors 208 and 209 in order to irradiate respective beam irradiation positions on the target object 101. Ideally, the multiple beams 20 irradiating at a time are aligned at pitches obtained by multiplying the arrangement pitch of a plurality of holes 22 in the shaping aperture array substrate 203 by a desired reduction ratio described above.

Figure 9:
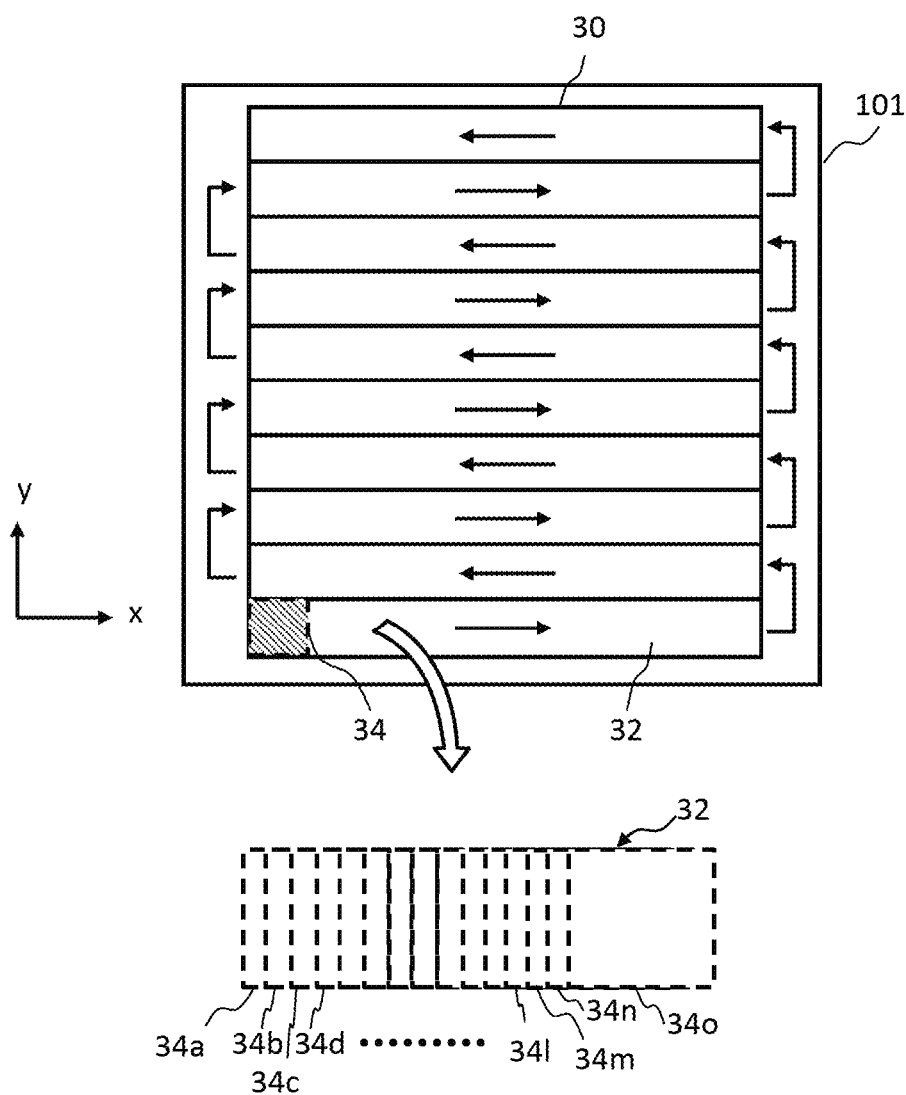
FIG. 9 is a conceptual diagram illustrating an example of a writing operation according to the first embodiment.

FIG. 9 is a conceptual diagram illustrating an example of a writing operation according to the first embodiment. As shown in FIG. 9, a writing region 30 of the target object 101 is virtually divided, for example, by a predetermined width in the y direction into a plurality of stripe regions 32 in a strip form. First, the XY stage 105 is moved to make an adjustment such that an irradiation region 34 which can be irradiated with one shot of the multiple beams 20 is located at the left end of the first stripe region 32 or at a position further left than the left end, and then writing is started. When writing the first stripe region 32, the XY stage 105 is moved, for example, in the −x direction, so that the writing may relatively proceed in the x direction. The XY stage 105 is moved, for example, continuously at a constant speed. After writing the first stripe region 32, the stage position is moved in the −y direction to make an adjustment such that the irradiation region 34 is located at the right end of the second stripe region 32 or at a position further right than the right end to be thus located relatively in the y direction. Then, by moving the XY stage 105 in the x direction, for example, writing proceeds in the −x direction. That is, writing is performed while alternately changing the direction, such as performing writing in the x direction in the third stripe region 32, and in the −x direction in the fourth stripe region 32, thereby reducing the writing time. However, the writing operation is not limited to the writing while alternately changing the direction, and it is also preferable to perform writing in the same direction when writing each stripe region 32. A plurality of shot patterns maximally up to as many as the number of the holes 22 are formed at a time by one shot of multiple beams having been formed by passing through the holes 22 in the shaping aperture array substrate 203. Further, although FIG. 9 shows the case where writing is performed once for each stripe region 32, it is not limited thereto. It is also preferable to perform multiple writing which writes the same region multiple times. In performing the multiple writing, preferably, the stripe region 32 of each pass is set while shifting the position.

Figure 10:
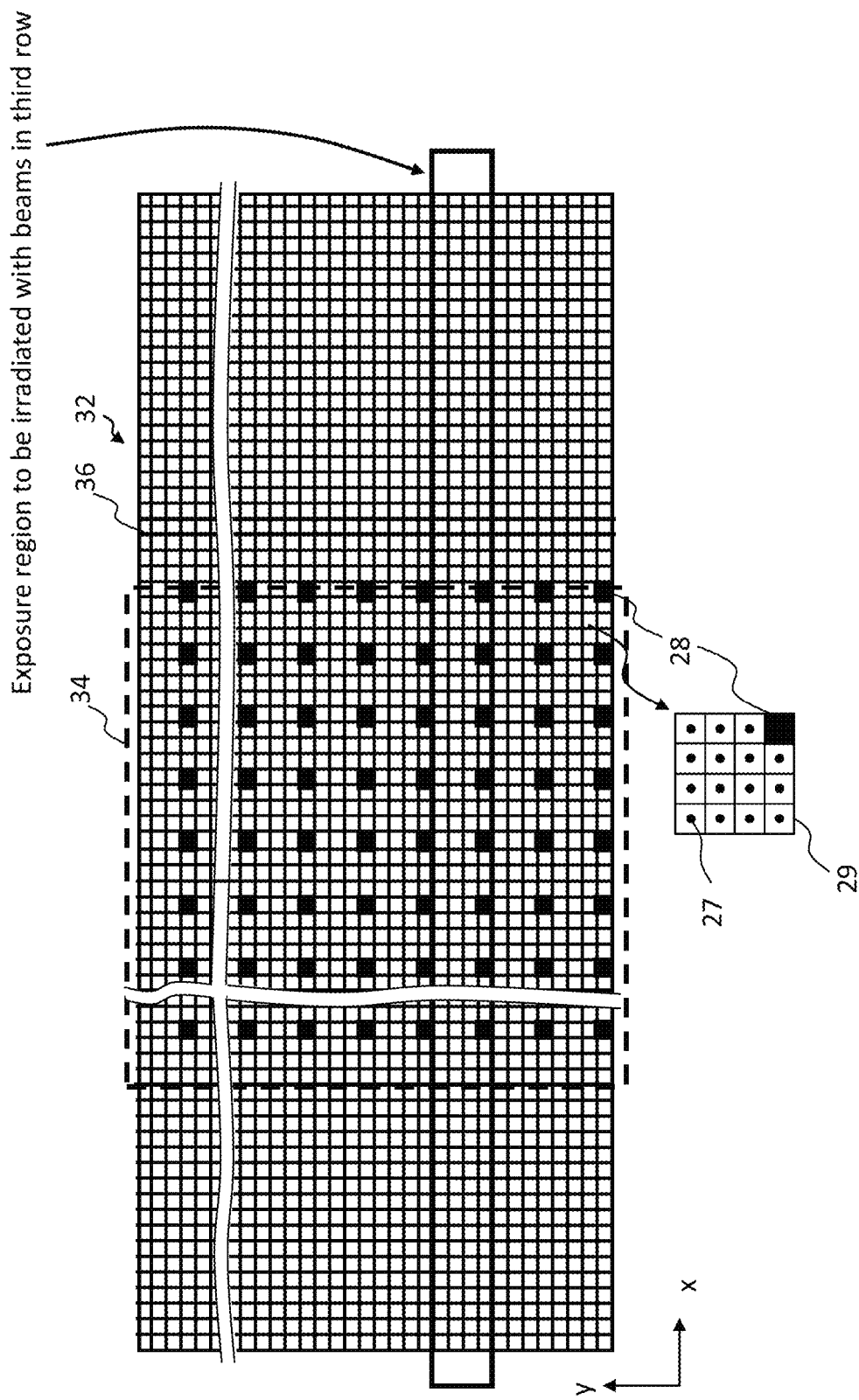
FIG. 10 is a diagram showing an example of an irradiation region of multiple beams and a writing target pixel according to the first embodiment.

FIG. 10 is a diagram showing an example of an irradiation region of multiple beams and a pixel to be written (writing target pixel) according to the first embodiment. In FIG. 10, in the stripe region 32, there are set a plurality of control grids 27 (design grids) arranged in a grid form at the beam size pitch of the multiple beams 20 on the surface of the target object 101, for example. Preferably, they are arranged at a pitch of around 10 nm. The plurality of control grids 27 serve as design irradiation positions of the multiple beams 20. The arrangement pitch of the control grid 27 is not limited to the beam size, and may be any size that can be controlled as a deflection position of the deflector 209 regardless of the beam size. Then, a plurality of pixels 36, each of which is centering on each control grid 27, are set by virtually dividing into a mesh form by the same size as that of the arrangement pitch of the control grid 27. Each pixel 36 serves as an irradiation unit region per beam of the multiple beams. FIG. 10 shows the case where the writing region of the target object 101 is divided, for example, in the y direction, into a plurality of stripe regions 32 by the width size being substantially the same as the size of the irradiation region (writing field) which can be irradiated by one irradiation with the multiple beams 20. The x-direction size of the irradiation region 34 can be defined by the value obtained by multiplying the beam pitch (pitch between beams) in the x direction of the multiple beams 20 by the number of beams in the x direction. The y-direction size of the irradiation region 34 can be defined by the value obtained by multiplying the beam pitch in the y direction of the multiple beams 20 by the number of beams in the y direction. The width of the stripe region 32 is not limited to this. Preferably, the width of the stripe region 32 is n times (n being an integer of one or more) the size of the irradiation region 34. FIG. 10 shows the case where the multiple beams of 512×512 (rows×columns) are simplified to 8×8 (rows× columns). In the irradiation region 34, there are shown a plurality of pixels 28 (beam writing positions) which can be irradiated with one shot of the multiple beams 20. In other words, the pitch between adjacent pixels 28 is the pitch between beams of the design multiple beams. In the example of FIG. 10, one sub-irradiation region 29 is a region surrounded by beam pitches. In the case of FIG. 10, each sub-irradiation region 29 is composed of 4×4 pixels.

Figure 11:
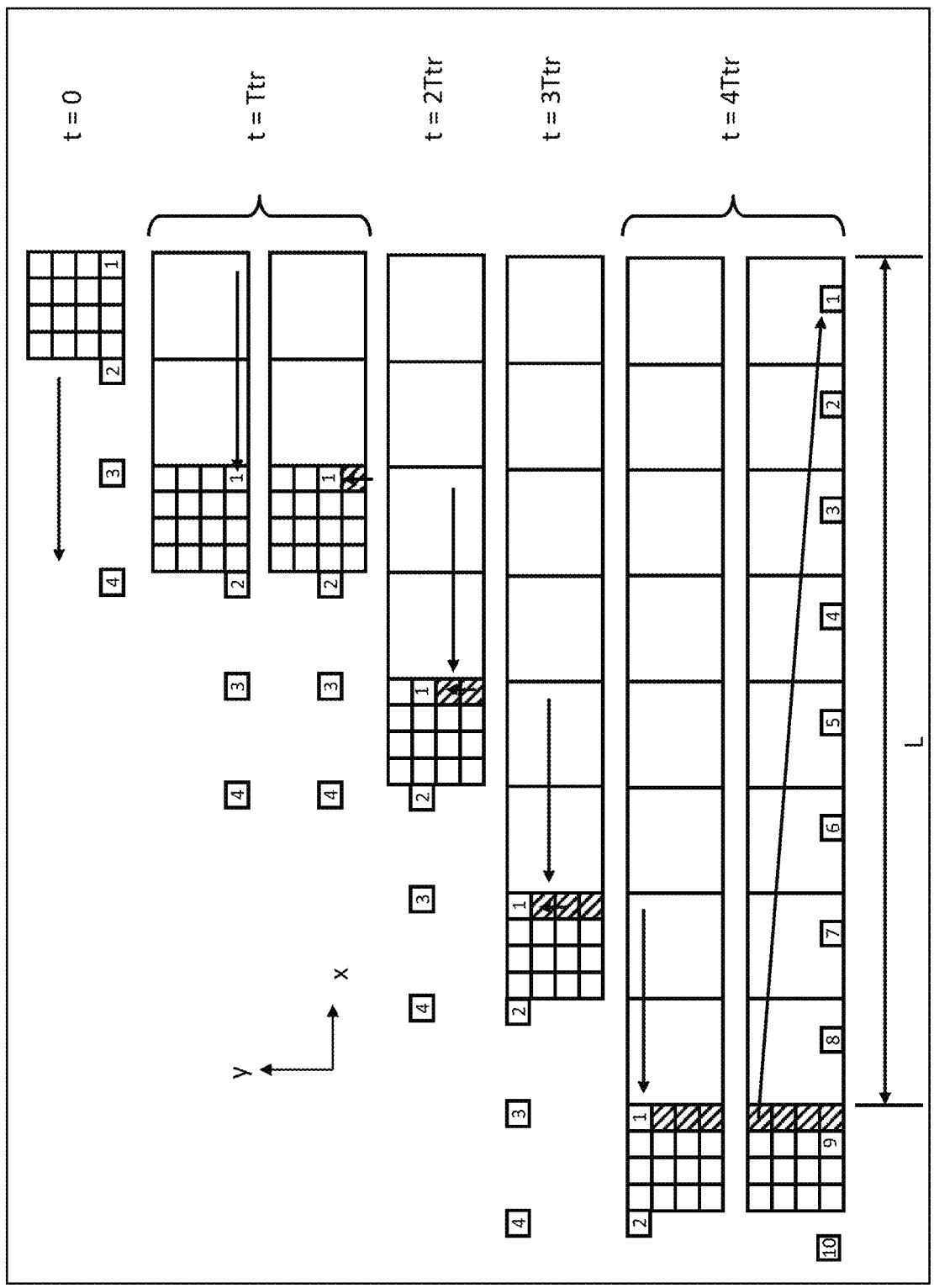
FIG. 11 is a diagram illustrating an example of a writing method of multiple beams according to the first embodiment.

FIG. 11 is a diagram illustrating an example of a writing method of multiple beams according to the first embodiment. FIG. 11 shows a portion of the sub-irradiation region 29 to be written by each of beams at the coordinates (1, 3), (2, 3), (3, 3), . . . , (512, 3) in the y-direction third row from the bottom in the multiple beams for writing the stripe region 32 shown in FIG. 10. In the example of FIG. 11, while the XY stage 105 moves the distance of eight beam pitches, four pixels are written (exposed), for example. In order that the relative position between the irradiation region 34 and the target object 101 may not be shifted by the movement of the XY stage 105 while these four pixels are written (exposed), the irradiation region 34 is made to follow the movement of the XY stage 105 by collective deflection of all of the multiple beams 20 by the deflector 208. In other words, tracking control is performed. In the case of FIG. 11, one tracking cycle is executed by writing (exposing) four pixels while shifting, per shot, the irradiation target pixel 36 in the y direction during a movement by the distance of eight beam pitches.

Specifically, the writing mechanism 150 irradiates each control grid 27 with a corresponding beam in an ON state in the multiple beams 20 during a writing time (irradiation time or exposure time) corresponding to each control grid 27 within a maximum irradiation time Ttr of the irradiation time of each beam of the multiple beams of the shot concerned. The maximum irradiation time Ttr is set in advance. Although the time obtained by adding a settling time of beam deflection to the maximum irradiation time Ttr actually serves as a shot cycle, the settling time of beam deflection is omitted here to indicate the maximum irradiation time Ttr as the shot cycle. After one tracking cycle is completed, the tracking control is reset so as to swing back (return) the tracking position to the starting position of a next tracking cycle.

Since writing of the pixels in the first column from the right of each sub-irradiation region 29 has been completed, in the next tracking cycle after resetting the tracking, first, the deflector 209 performs deflection such that the writing position of each corresponding beam is adjusted (shifted) to the control grid 27 of the pixel at the bottom row in the second column from the right of each sub-irradiation region 29.

As described above, in the state where the relative position of the irradiation region 34 to the target object 101 is controlled by the deflector 208 to be the same (unchanged) position during the same tracking cycle, each shot is carried out while performing shifting from a control grid (a pixel 36) to another control grid 27 (another pixel 36) by the deflector 209. Then, after finishing one tracking cycle and returning the tracking position of the irradiation region 34, the first shot position is adjusted to the position shifted by, for example, one control grid (one pixel) as shown in the lower part of FIG. 10, and each shot is performed shifting from one control grid (one pixel) to another control grid (another pixel) by the deflector 209 while executing a next tracking control. By repeating this operation during writing the stripe region 32, the position of the irradiation region 34 is shifted sequentially, such as from 34a to 34o, to perform writing of the stripe region concerned.

Based on the writing sequence, it is determined which beam of the multiple beams irradiates which control grid (pixel 36) on the target object 101. Supposing that the sub-irradiation region 29 is a region composed of n×n pixels, n control grids (n pixels) are written by one tracking operation. Then, by the next tracking operation, other n pixels in the same n×n pixel region are similarly written by a different beam from the one used above. Thus, writing is performed for each n pixels by a different beam each time in n-time tracking operations, thereby writing all of the pixels in one region of n×n pixels. With respect also to other sub-irradiation regions 29 each composed of n×n pixels in the irradiation region of multiple beams, the same operation is executed at the same time so as to perform writing similarly.

As described above, since the resistance of the cathode mechanism 222 is stabilized, a stable electron beam 200 can be emitted. Thus, writing can be performed with high precision.

Embodiments have been explained referring to specific examples described above. However, the present invention is not limited to these specific examples.

While the apparatus configuration, control method, and the like not directly necessary for explaining the present invention are not described, some or all of them can be appropriately selected and used on a case-by-case basis when needed. For example, although description of the configuration of the control unit for controlling the writing apparatus 100 is omitted, it should be understood that some or all of the configuration of the control unit can be selected and used appropriately when necessary.

Further, any other cathode mechanism of electron guns, electron gun, and electron beam writing apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A cathode mechanism of an electron gun comprising:
a crystal configured to emit a thermal electron from an end surface by being heated;
a holding part configured to hold the crystal in a state where the end surface is exposed and at least a part of other surfaces of the crystal is covered;
a first supporting post and a second supporting post each configured to support the holding part and extend while maintaining an unchanged sectional size;
a first base part configured to fix the first supporting post; and
a second base part configured to fix the second supporting post,
wherein the holding part, the first supporting post, the second supporting post, the first base part, and the second base part are formed in an integrated structure made of a same material, and the crystal is heated by supplying a current to the integrated structure.

2. The mechanism according to claim 1, wherein each of the first supporting post and the second supporting post has a cross-sectional configuration in which three sides are straight lines and one side is a curved line.

3. The mechanism according to claim 1, wherein the crystal is formed in a shape of at least one of a cylinder and a truncated cone.

4. The mechanism according to claim 1, wherein the first supporting post and the second supporting post function as a heater for heating the crystal through the holding part.

5. The mechanism according to claim 1, wherein crystal orientations in the end surface are same.

6. The mechanism according to claim 1, wherein as a material of the integrated structure, one of graphite, tantalum, tungsten, and iridium is used.

7. The mechanism according to claim 1, wherein a continuous space having a same width is formed from a back side of the holding part, between the first supporting post and the second supporting post, and between the first base part and the second base part.

8. The mechanism according to claim 7, wherein each of the first supporting post and the second supporting post has a cross-sectional configuration in which three sides are straight lines and one side is a curved line.

9. An electron gun comprising:
a cathode mechanism of an electron gun according to claim 1; and
an anode electrode configured to be controlled to have a potential more positive than that of a crystal and to pull out a thermal electron emitted from the crystal.

10. An electron beam writing apparatus comprising:
an electron gun according to claim 9; and
a writing mechanism configured to write a pattern on a target object using a thermal electron emitted from the electron gun.

* * * * *